United States Patent
Itkin et al.

(10) Patent No.: US 10,010,007 B2
(45) Date of Patent: Jun. 26, 2018

(54) MULTI-SLOT PLUG-IN CARD

(71) Applicant: Mellanox Technologies Ltd., Yokneam (IL)

(72) Inventors: Yuval Itkin, Zoran (IL); Avraham Ganor, Shoham (IL); Andrey Blyahman, Haifa (IL)

(73) Assignee: MELLANOX TECHNOLOGIES, LTD., Yokneam (IL)

( * ) Notice: Subject to any disclaimer, the term of this patent is extended or adjusted under 35 U.S.C. 154(b) by 91 days.

(21) Appl. No.: 14/963,266

(22) Filed: Dec. 9, 2015

(65) Prior Publication Data

US 2017/0172007 A1      Jun. 15, 2017

(51) Int. Cl.
| | |
|---|---|
| H05K 1/11 | (2006.01) |
| H05K 7/14 | (2006.01) |
| H05K 3/46 | (2006.01) |
| G06F 1/18 | (2006.01) |
| H01R 13/66 | (2006.01) |
| H01R 13/187 | (2006.01) |
| H05K 1/02 | (2006.01) |
| H05K 1/14 | (2006.01) |

(52) U.S. Cl.
CPC ........... *H05K 7/1452* (2013.01); *G06F 1/185* (2013.01); *H05K 1/117* (2013.01); *H05K 3/4611* (2013.01); *H05K 7/1439* (2013.01); *H05K 1/028* (2013.01); *H05K 1/148* (2013.01); *H05K 3/4691* (2013.01); *H05K 2201/10189* (2013.01)

(58) Field of Classification Search
CPC .......... H05K 1/14; H05K 1/141; H05K 1/142; H05K 2201/10325; H05K 2201/1034; H05K 5/0286; H05K 5/0291; H05K 1/118; H05K 1/147; H05K 1/148; H05K 3/4691; H01R 12/724; H01R 13/665; H01R 13/6658; H01R 23/7073
USPC ........ 361/784, 785, 788, 789, 791; 439/844, 439/854, 541.5, 620.12, 620.15, 620.16
See application file for complete search history.

(56) References Cited

U.S. PATENT DOCUMENTS

| | | | |
|---|---|---|---|
| 4,885,482 A | | 12/1989 | Sharp et al. |
| 5,224,023 A | * | 6/1993 | Smith ............... G06F 1/184 174/254 |
| 5,572,688 A | | 11/1996 | Sytwu |
| 5,740,378 A | | 4/1998 | Rehl et al. |

(Continued)

OTHER PUBLICATIONS

PCI Express® Base Specification, Revision 3.1 , 1073 pages, Mar. 2014.

*Primary Examiner* — Binh Tran
(74) *Attorney, Agent, or Firm* — D. Kligler IP Services Ltd.

(57) ABSTRACT

Electronic apparatus includes a laminated multi-layer circuit substrate, including first and second rigid cards and a flexible section between the first and second rigid cards. First and second sets of electrical terminals are disposed respectively on the first and second rigid cards and arranged to mate with respective bus connectors configured in accordance with a predefined bus standard. At least one bus interface circuit is configured to communicate over a bus in accordance with the predefined bus standard and disposed on the first rigid card. Printed conductors run continuously from the first rigid card, over the flexible section of the substrate, to the second rigid card and connect the at least one bus interface circuit on the first rigid card to the second set of electrical terminals on the second rigid card.

15 Claims, 2 Drawing Sheets

(56) References Cited

U.S. PATENT DOCUMENTS

| | | |
|---|---|---|
| 5,812,801 A | 9/1998 | Saperstein et al. |
| 5,852,617 A | 12/1998 | Mote, Jr. |
| 6,101,557 A | 8/2000 | Movall et al. |
| 6,216,194 B1 | 4/2001 | Aoyama et al. |
| 6,590,781 B2* | 7/2003 | Kollipara ............. G06F 13/409 174/250 |
| 6,668,300 B1 | 12/2003 | Marshall, Jr. et al. |
| 8,601,196 B2 | 12/2013 | Sun |
| 8,756,360 B1 | 6/2014 | Richard |
| 2010/0307798 A1* | 12/2010 | Izadian ................. H01L 24/24 174/255 |
| 2012/0260015 A1 | 10/2012 | Gay et al. |
| 2013/0238827 A1 | 9/2013 | Lin |
| 2015/0286602 A1 | 10/2015 | Buckland et al. |

* cited by examiner

MULTI-SLOT PLUG-IN CARD

FIELD OF THE INVENTION

The present invention relates generally to electronic circuits and systems, and particularly to circuit boards used in computers.

BACKGROUND

Many computers have plug-in bus architectures, with a motherboard or other backplane having multiple bus slots. Each slot accommodates a single printed circuit board (PCB), with a bus controller circuit on the board to transmit and receive communications over the bus. Recently, Intel® introduced processors with interfaces to the PCI Express (PCIe®) bus that are capable of "PCIe slot bifurcation," meaning that different groups of bus lanes can be operated separately by different controllers. In this regard, for example, U.S. Patent Application Publication 2012/0260015 describes a PCIe port bifurcation card that includes a PCIe interface and a plurality of PCIe devices, each independently coupled to the interface via an unswitched connection. In most systems, however, each plug-in card is limited to a single bus interface.

Some plug-in cards are capable of connecting to multiple bus slots. For example, U.S. Pat. No. 5,572,688 describes a computer that has a primary bus including a primary bus interconnection slot and a secondary bus including a secondary bus interconnection slot. A primary bus card has a primary bus connector region for connection with the primary bus interconnection slot. The primary bus card includes a processing circuit electrically connected to the primary bus connector region to process primary bus signals from the primary bus. In addition, the primary bus card has a bridge cable connector electrically connected to the processing circuit. A secondary bus connector is positionable within the secondary bus interconnection slot. A bridge cable is connected between the bridge cable connector and the secondary bus connector to convey secondary bus signals from the secondary bus connector to the processing circuit.

As another example, U.S. Pat. No. 5,740,378 describes a communication system having an over-the-top ribbon cable data bus configuration. The ribbon cables are segmented and redirected between individual circuit boards and a backplane data bus. Each ribbon cable connects either directly to the backplane or to an interposer board coupled between the circuit board and the backplane.

SUMMARY

Embodiments of the present invention that are described hereinbelow provide improved circuit boards for computing and communication systems.

There is therefore provided, in accordance with an embodiment of the invention, electronic apparatus, which includes a laminated multi-layer circuit substrate, including first and second rigid cards and a flexible section between the first and second rigid cards. First and second sets of electrical terminals are disposed respectively on the first and second rigid cards and arranged to mate with respective bus connectors configured in accordance with a predefined bus standard. At least one bus interface circuit is configured to communicate over a bus in accordance with the predefined bus standard and disposed on the first rigid card. Printed conductors running continuously from the first rigid card, over the flexible section of the substrate, to the second rigid card connect the at least one bus interface circuit on the first rigid card to the second set of electrical terminals on the second rigid card.

In some embodiments, the first and second sets of the electrical terminals are configured as edge connectors, which plug into the respective bus connectors. In one embodiment, the substrate and edge connectors are configured so that the edge connectors plug into the respective bus connectors in a pair of neighboring bus slots on a backplane.

In a disclosed embodiment, there are no active electronic components on the second rigid card.

In some embodiments, the respective bus connectors are configured in accordance with a PCI Express standard.

Typically, the at least one bus interface circuit includes first and second bus interface circuits, which are disposed on the first rigid card and are connected respectively to the first and second sets of the electrical terminals.

Additionally or alternatively, the respective bus connectors include first and second bus connectors disposed on first and second buses, which connect respectively to different, first and second buses associated respectively with first and second central processing units.

There is also provided, in accordance with an embodiment of the invention, a method for production, which includes forming a laminated multi-layer circuit substrate, including first and second rigid cards and a flexible section between the first and second rigid cards. First and second sets of electrical terminals are deposited respectively on the first and second rigid cards in an arrangement defined so as to mate with respective bus connectors configured in accordance with a predefined bus standard. At least one bus interface circuit, which is configured to communicate over a bus in accordance with the predefined bus standard, is placed on the first rigid card. Conductors are printed on the substrate so as to run continuously from the first rigid card, over the flexible section of the substrate, to the second rigid card and connect the at least one bus interface circuit on the first rigid card to the second set of electrical terminals on the second rigid card.

The present invention will be more fully understood from the following detailed description of the embodiments thereof, taken together with the drawings in which:

DETAILED DESCRIPTION OF EMBODIMENTS

As the designs of servers and communication appliances become ever denser, there is often a need to provide multiple interfaces to the system bus, such as a PCIe bus, on the same plug-in card. Although slot bifurcation, as mentioned above in the Background section, can offer a solution to this need in some cases, many servers and processing components do not support such bifurcation.

Embodiments of the present invention that are described herein address this problem by providing printed circuit boards with dual bus connections. These boards are based on a laminated multi-layer circuit substrate, comprising two rigid cards and a flexible section between them. On each of the rigid cards, a set of electrical terminals is arranged to mate with a respective bus connector, configured in accordance with a predefined bus standard, such as PCIe. (Typically, although not necessarily, the electrical terminals are configured as edge connectors at the outer edges of the rigid cards, which plug into respective bus slot connectors.) Printed conductors run continuously between the two rigid cards over the flexible section of the substrate, and thus connect a bus interface circuit mounted on one rigid card directly to the set of electrical terminals on the other rigid card.

In this manner, the bus controller (or two bus controllers, each connected to a respective set of the electrical terminals), along with all the other functional components on the board, can be mounted on one of the rigid cards. There is thus no need for active electronic components on the other rigid card, whose sole purpose is to make a second physical bus connection. The conductors run "continuously" over the board, including the flexible section, in the sense that they are formed as continuous metal strips on one or more layers of the substrate, without intervening cables (such as ribbon cables) or connectors. This continuous mode of construction is important in supporting the high signal frequencies that are required by the high data rate of PCIe and other advance bus architectures. On the other hand, the combined rigid/flexible construction of the printed circuit board makes it easy to plug the edge connectors on the two rigid cards into the respective bus connectors in a pair of neighboring bus slots on a backplane, such as a server motherboard or an active or passive backplane. Thus, the board has two interfaces to the same bus without the need for special bifurcation circuitry or exotic mechanical arrangements.

Figure 1:
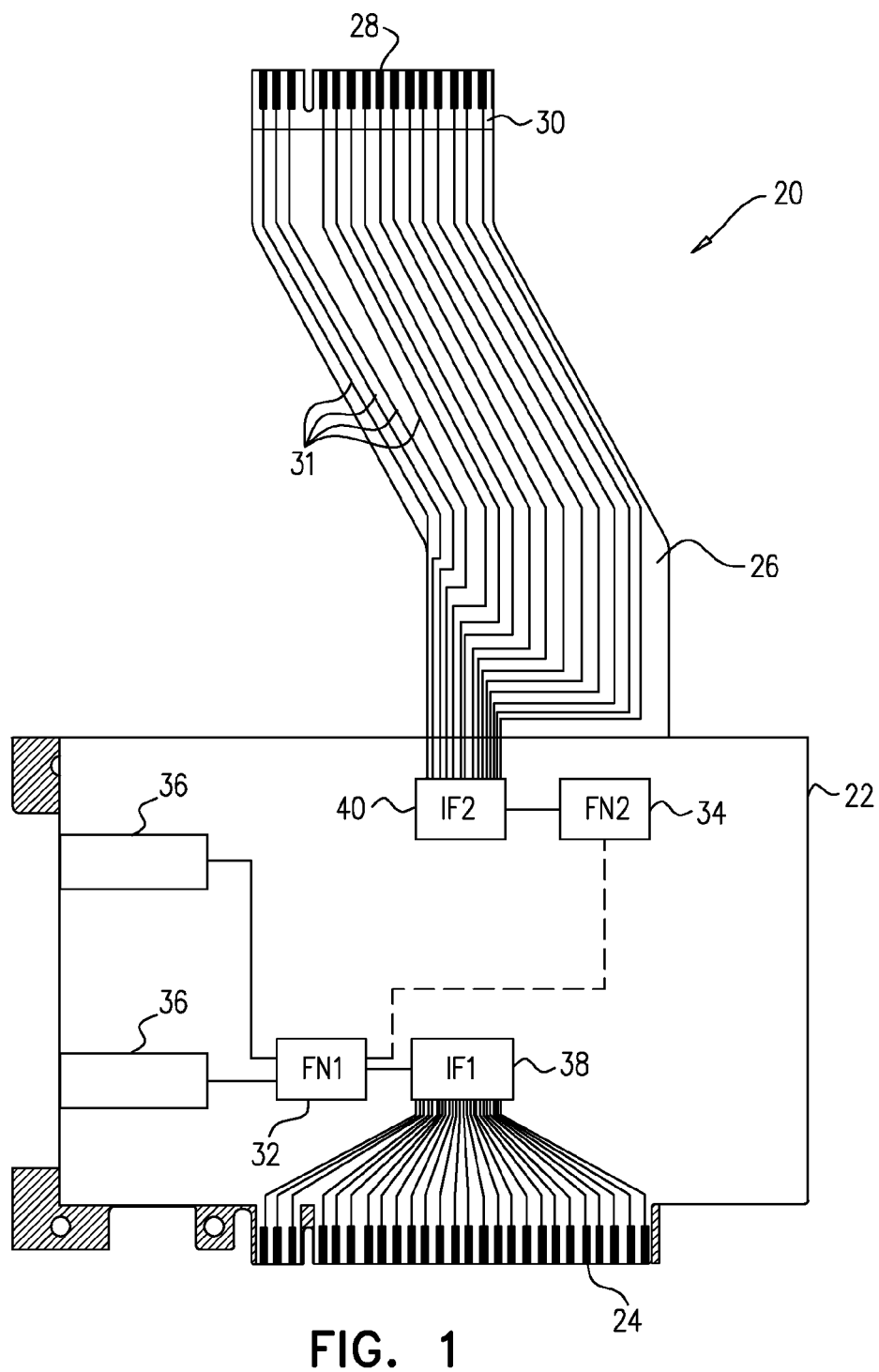
FIG. 1 is a schematic frontal view of a plug-in printed circuit board with dual bus interfaces, in accordance with an embodiment of the invention.

FIG. 1 is a schematic frontal view of a plug-in printed circuit board 20 with dual bus interfaces, in accordance with an embodiment of the invention. Board 20 comprises a laminated multi-layer circuit substrate, comprising two rigid cards 22 and 30 with a flexible section 26 between them. This sort of board includes printed metal layers, such as conductors 31, that run continuously over the board between the rigid and flexible sections. Boards combining rigid and flexible printed circuit technologies can be made to order by a number of suppliers, including, for example, Unimicron Corporation (Taoyuan City, Taiwan).

Card 22 is configured as a standard plug-in card for a bus, such as a PCIe bus, while card 30 is configured simply as an edge connector, with much smaller dimensions than card 22. For this purpose, card 22 has terminals 24, which are arranged to mate with a PCIe bus connector (or alternatively, some other connector configured in accordance with another bus standard), and card 30 has similar terminals 28. In the pictured embodiment, card 30 contains no electronic components other than terminals 28. In alternative embodiments (not shown in the figures), however, card 30 may have passive and/or active components mounted on it.

Functional electronic components 32 and 34 are mounted on card 22. In one embodiment, component 32 comprises a high-speed packet switch, while component 34 comprises a memory controller, which is connected to memory components (not shown) either on or off board 20. Component 32 in this embodiment is connected to communication sockets 36, such as SFP transceiver receptacles, for example, that open through a panel at the edge of card 22. Alternatively, one or more of components 32 and 34 may comprise a microprocessor, an input/output (I/O) controller, or any other suitable sort of component that is known in the art. Components 32 and 34 may comprise hard-wired and/or programmable logic components, such as a field-programmable gate array (FPGA). Typically, but not necessarily, components 32 and 34 also communicate with one another, as indicated by a dashed line in FIG. 1. Although components 32 and 34 and interfaces 38 and 40 are shown in FIG. 1, for the sake of clarity, as separate functional elements, in practice two or more of these elements may be implemented in a single integrated circuit chip. Alternatively, either or both of components 32 and 34 may comprise multiple chips.

Components 32 and 34 communicate over a bus, for example, a PCIe bus, via respective bus interface circuits 38 and 40, which are mounted on card 22 and are connected respectively to terminals 24 and 28. Interface circuits 38 and 40 operate in accordance with an appropriate, predefined bus standard, such as the PCIe standard. Bus interface circuit 38 is connected to terminals 24 by conductors on card 22 itself, while bus interface circuit 40 is connected by conductors 31, which run continuously over flexible section 26 to terminals 28.

Figure 2:
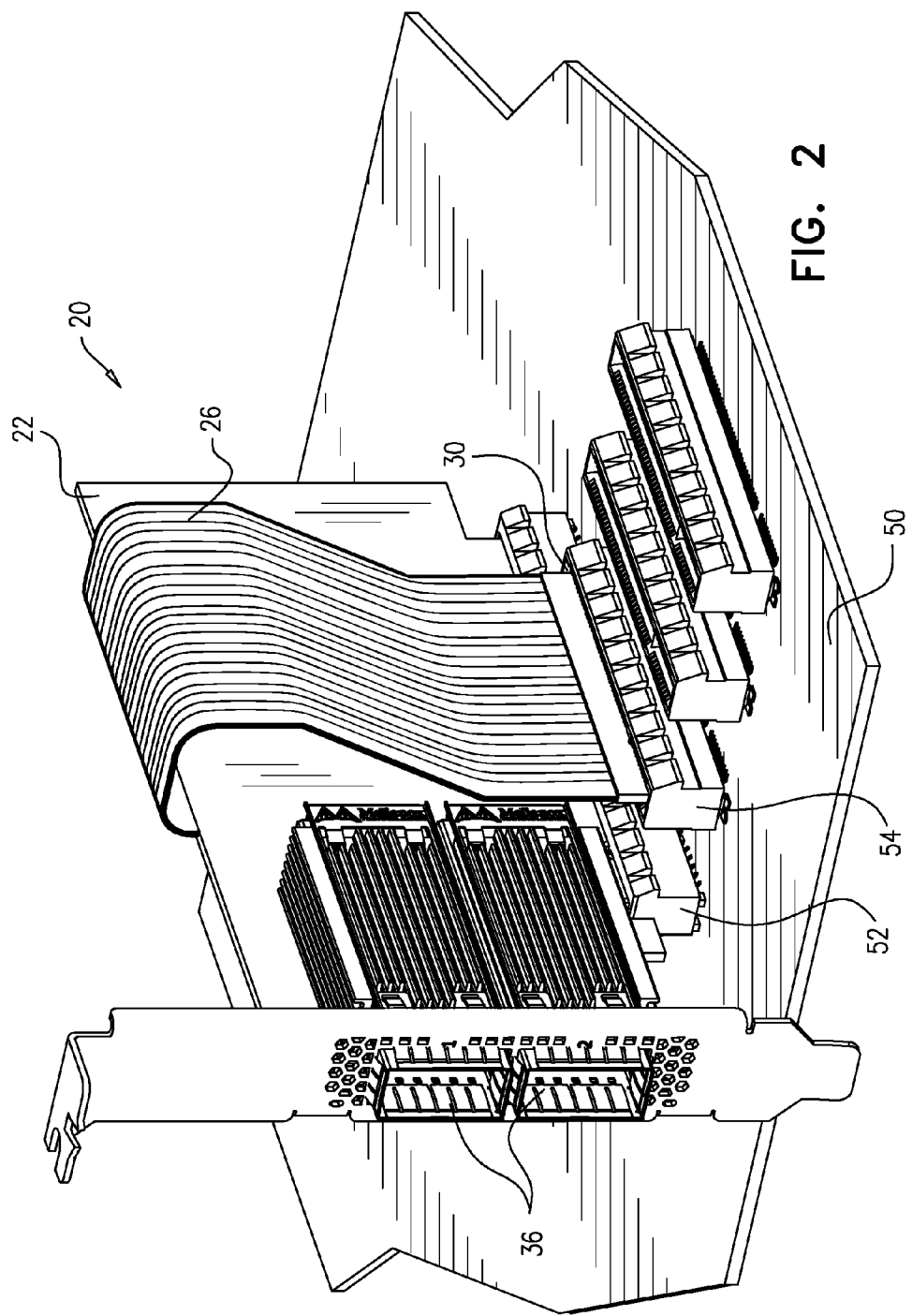
FIG. 2 is a schematic pictorial illustration of the board of FIG. 1 plugged into a bus, in accordance with an embodiment of the invention.

FIG. 2 is a schematic pictorial illustration of board 20 plugged into a bus on a backplane 50, in accordance with an embodiment of the invention. Backplane 50 typically comprises, for example, a server motherboard or an active or passive backplane, as noted above, and includes multiple bus slots, each with a corresponding bus connector 52, 54, . . . . In the pictured example, the edge connectors defined by terminals 24 and 28 on cards 22 and 30 plug respectively into bus connectors 52 and 54 in a pair of neighboring bus slots on backplane 50. Board 20 functions electrically as a single printed circuit board, without cables or connectors between the two bus connectors, while flexible section 26 makes it possible for board 20 to occupy two bus slots without special mechanical adaptation.

The two bus slots may be on the same bus, connecting to the same central processing unit (CPU), for example; or alternatively, each bus slot may be on a different, respective bus connecting to or otherwise associated with a different CPU. As noted earlier, the possibility of connecting board 20 to multiple bus slots is particularly useful in servers that do not support bus bifurcation.

Although FIGS. 1 and 2 show a particular electrical and mechanical configuration of board 20, other configurations using a mixed rigid and flexible board to occupy multiple slots on a given bus will be apparent to those skilled in the art and are considered to be within the scope of the present invention. In particular, card 30 and flexible section 26 may be configured so that card 30 plugs into a slot on either side of card 22. In another embodiment (not shown in the figures), a board may comprise multiple flexible sections between suitable rigid cards in order to occupy three or more bus slots.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:
1. Electronic apparatus, comprising:
  a laminated multi-layer circuit substrate, comprising first and second rigid cards and a flexible section between the first and second rigid cards;
  first and second sets of electrical terminals disposed respectively on the first and second rigid cards and arranged to mate with respective bus connectors configured in accordance with a predefined bus standard;

at least one bus interface circuit, configured to communicate over a bus in accordance with the predefined bus standard and disposed on the first rigid card, wherein no bus interface circuit is disposed on the second rigid card; and printed conductors running continuously, without intervening cables or connectors, from the first rigid card, over the flexible section of the substrate and over portions of the first and second rigid cards, to the second rigid card and connecting the at least one bus interface circuit on the first rigid card to the second set of electrical terminals on the second rigid card.

2. The apparatus according to claim 1, wherein the first and second sets of the electrical terminals are configured as edge connectors, which plug into the respective bus connectors.

3. The apparatus according to claim 2, wherein the substrate and edge connectors are configured so that the edge connectors plug into the respective bus connectors in a pair of neighboring bus slots on a backplane.

4. The apparatus according to claim 1, wherein the first rigid card has active electrical components mounted thereon and wherein there are no active electronic components on the second rigid card.

5. The apparatus according to claim 1, wherein the respective bus connectors are configured in accordance with a PCI Express standard.

6. The apparatus according to claim 1, wherein the at least one bus interface circuit comprises first and second bus interface circuits, which are disposed on the first rigid card and are connected respectively to the first and second sets of the electrical terminals.

7. The apparatus according to claim 1, wherein the second rigid card is smaller than the first rigid card.

8. The apparatus according to claim 1, wherein all the functional components on the laminated multi-layer circuit substrate are deposited on the first rigid card.

9. The apparatus according to claim 1, wherein the second rigid card contains no electronic components except for the second set of electrical terminals.

10. A method for production, comprising:
forming a laminated multi-layer circuit substrate, comprising first and second rigid cards and a flexible section between the first and second rigid cards;

depositing first and second sets of electrical terminals respectively on the first and second rigid cards in an arrangement defined so as to mate with respective bus connectors configured in accordance with a predefined bus standard;

placing on the first rigid card at least one bus interface circuit that is configured to communicate over a bus in accordance with the predefined bus standard, wherein no bus interface circuit is placed on the second rigid card; and printing conductors on the substrate so as to run continuously, without intervening cables or connectors, from the first rigid card, over the flexible section of the substrate and over portions of the first and second rigid cards, to the second rigid card and connect the at least one bus interface circuit on the first rigid card to the second set of electrical terminals on the second rigid card.

11. The method according to claim 10, wherein depositing the first and second sets of the electrical terminals comprises incorporating the electrical terminals in edge connectors, which plug into the respective bus connectors.

12. The method according to claim 11, wherein the substrate and edge connectors are configured so that the edge connectors plug into the respective bus connectors in a pair of neighboring bus slots on a backplane.

13. The method according to claim 10, wherein the first rigid card has active electrical components mounted thereon and wherein there are no active electronic components on the second rigid card.

14. The method according to claim 10, wherein the respective bus connectors are configured in accordance with a PCI Express standard.

15. The method according to claim 10, wherein placing the at least one bus interface circuit comprises mounting first and second bus interface circuits on the first rigid card, and connecting the first and second bus interface circuits respectively to the first and second sets of the electrical terminals.

* * * * *